US011195995B2

(12) United States Patent
Liu et al.

(10) Patent No.: US 11,195,995 B2
(45) Date of Patent: Dec. 7, 2021

(54) BACK-END-OF-LINE COMPATIBLE PROCESSING FOR FORMING AN ARRAY OF PILLARS

(71) Applicant: International Business Machines Corporation, Armonk, NY (US)

(72) Inventors: Chi-Chun Liu, Altamont, NY (US); Yann Mignot, Slingerlands, NY (US); Ekmini Anuja De Silva, Slingerlands, NY (US); Nelson Felix, Slingerlands, NY (US); John Christopher Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 16/735,020

(22) Filed: Jan. 6, 2020

(65) Prior Publication Data
US 2021/0210679 A1 Jul. 8, 2021

(51) Int. Cl.
*H01L 43/12* (2006.01)
*H01L 43/02* (2006.01)
*H01L 27/22* (2006.01)

(52) U.S. Cl.
CPC ............ *H01L 43/12* (2013.01); *H01L 27/222* (2013.01); *H01L 43/02* (2013.01)

(58) Field of Classification Search
None
See application file for complete search history.

(56) References Cited

U.S. PATENT DOCUMENTS

| | | | |
|---|---|---|---|
| 8,455,364 B2 | 6/2013 | Kanakasabapathy | |
| 8,802,451 B2 | 8/2014 | Malmhall et al. | |
| 9,679,781 B2 | 6/2017 | Abatchev et al. | |
| 9,978,863 B2 | 5/2018 | Colinge et al. | |
| 2015/0155176 A1 | 6/2015 | Mignot et al. | |
| 2015/0243518 A1 | 8/2015 | deVilliers | |
| 2017/0229349 A1 | 8/2017 | Fu et al. | |
| 2018/0005875 A1 | 1/2018 | Burns et al. | |
| 2018/0138187 A1 | 5/2018 | Ogino | |
| 2018/0174894 A1* | 6/2018 | Bouche | H01L 21/31144 |

* cited by examiner

*Primary Examiner* — Anthony Ho
*Assistant Examiner* — Kevin Quinto
(74) *Attorney, Agent, or Firm* — Abdy Raissinia; Ryan, Mason & Lewis, LLP

(57) ABSTRACT

A method of forming a semiconductor structure includes forming a memorization layer over a substrate, forming a first self-aligned double patterning (SADP) stack including a first organic planarization layer (OPL), masking layer, set of mandrels, and set of spacers, and forming a patterned memorization layer by transferring a first pattern of the first set of spacers to the memorization layer. The method also includes forming a second SADP stack comprising a second OPL, masking layer, set of mandrels, and set of spacers, and forming an array of pillars by transferring a second pattern of the second set of spacers to the patterned memorization layer. The first and second OPL and the first and second sets of mandrels are a spin-on coated OPL material, and the memorization layer and first and second masking layers are a material configured for removal selective to the spin-on coated OPL material.

20 Claims, 11 Drawing Sheets

200

300

400

500

600

700

800

850

900

1000

BACK-END-OF-LINE COMPATIBLE PROCESSING FOR FORMING AN ARRAY OF PILLARS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Increased density allows for reduction in signal propagation times and increased noise immunity resulting from shorter interconnection length. In memory devices, reduced memory element size and increased integration density provides these and other benefits as well as increased memory capacity and decreased costs per memory element or cell.

SUMMARY

Embodiments of the invention provide techniques for forming an array of pillars utilizing back-end-of-line (BEOL)-compatible processing.

In one embodiment, a method of forming a back-end-of-line memory device comprises forming a memorization layer over a substrate and forming a first self-aligned double patterning stack, the first self-aligned double patterning stack comprising a first organic planarization layer formed over the memorization layer, a first masking layer formed over the first organic planarization layer, a first set of mandrels formed over the first masking layer, and a first set of spacers formed on sidewalls of the first set of mandrels. The method also comprises forming a patterned memorization layer by transferring a first pattern of the first set of spacers to the memorization layer and forming a second self-aligned double patterning stack, the second self-aligned double patterning stack comprising a second organic planarization layer formed over the patterned memorization layer, a second masking layer formed over the second organic planarization layer, a second set of mandrels formed over the second masking layer, and a second set of spacers formed on sidewalls of the second set of mandrels. The method further comprises forming an array of pillars from the patterned memorization layer by transferring a second pattern of the second set of spacers to the patterned memorization layer. The first organic planarization layer, the second organic planarization layer, the first set of mandrels and the second set of mandrels comprise a spin-on coated organic planarization layer material. The memorization layer, the first masking layer and the second masking layer comprise a material configured for removal selective to the spin-on coated organic planarization layer material.

In another embodiment, a method of forming a semiconductor structure comprises forming a memorization layer over a substrate, forming a first organic planarization layer over the memorization layer, forming a first masking layer over the first organic planarization layer, forming a first set of mandrels over the first masking layer, the first set of mandrels being aligned in a first direction, forming a first set of spacers on sidewalls of the first set of mandrels, and transferring a first pattern of the first set of spacers to the memorization layer, wherein transferring the first pattern of the first set of spacers to the memorization layer comprises removing the first set of mandrels, the first set of spacers, the first masking layer and the first organic planarization layer. The method also comprises forming a second organic planarization layer over the patterned memorization layer, forming a second masking layer over the second organic planarization layer, forming a second set of mandrels over the second masking layer, the second set of mandrels being aligned in a second direction different than the first direction, forming a second set of spacers on sidewalls of the second set of mandrels, and transferring a second pattern of the second set of spacers to the patterned memorization layer to form an array of pillars from the patterned memorization layer, wherein transferring the second pattern of the second set of spacers to the memorization layer comprises removing the second set of mandrels, the second set of spacers, the second masking layer and the second organic planarization layer.

In another embodiment, a semiconductor structure comprises a substrate, a memorization layer disposed over the substrate, an organic planarization layer disposed over the memorization layer, a masking layer disposed over the organic planarization layer, a set of mandrels disposed over the masking layer, and a set of spacers disposed on sidewalls of the set of mandrels. A pattern of the set of spacers is configured for transfer to the memorization layer using fabrication processes within a thermal budget of a back-end-of-line memory device. The organic planarization layer and the set of mandrels comprise a spin-on coated organic planarization layer material. The memorization layer and the masking layer comprise a material configured for removal selective to the spin-on coated organic planarization layer material.

DETAILED DESCRIPTION

Figure 1A:
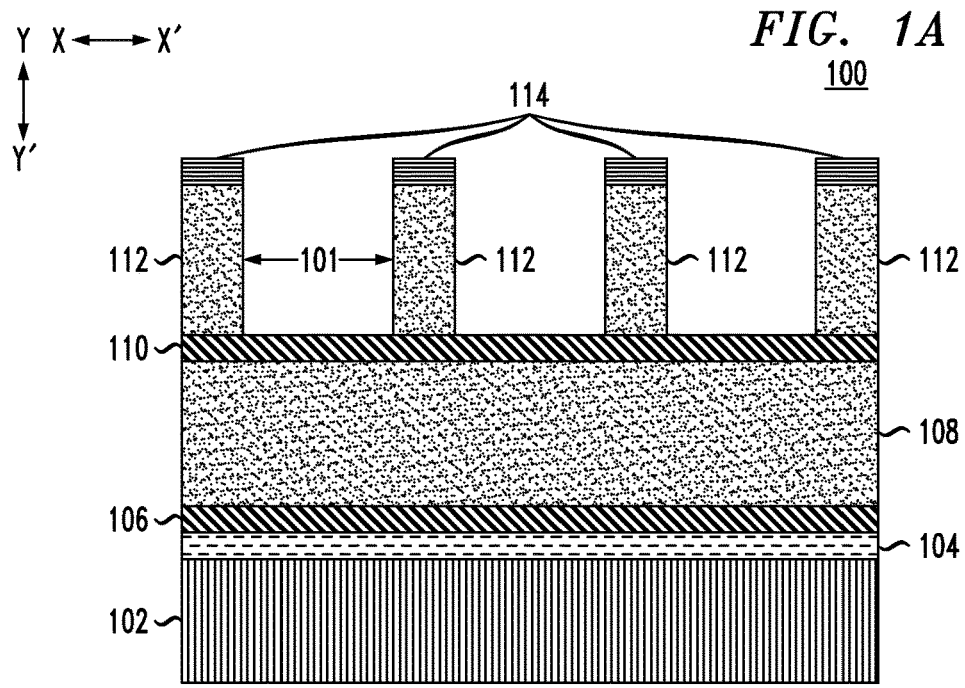
FIG. 1A depicts a side cross-sectional view of a semiconductor structure with a first set of mandrels, according to an embodiment of the invention.

Illustrative embodiments of the invention may be described herein in the context of illustrative methods for forming an array of pillars using back-end-of-line (BEOL)-compatible processing, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

Depending on performance requirements (e.g., access times) and operating conditions (e.g., power requirements, refresh requirements, etc.), various types of memory elements can be designed and fabricated. Memory elements capable of storing data for long periods of time without requiring power (other than when data is written, erased, or read) are referred to as non-volatile memory elements.

Non-volatile random-access memory (NVRAM) technology includes structures such as magnetoresistive random-access memory (MRAM). In memory devices that utilize NVRAM technology, arrays of pillars may be used (e.g., where the pillars correspond to cells of a memory device). Critical dimension (CD) control in such structures may be achieved through the use of two self-aligned double patterning (SADP) steps. The SADP steps may be "perpendicular" to one another, or angled relative to one another. An additional lithographic step may be used for cutting to form a desired structure shape. BEOL-compatible memory applications may be subject to various constraints relating to materials, a thermal budget for processing, etc.

Conventional techniques for forming pillars typically rely on one or more front-end-of-line (FEOL) chemical vapor deposition (CVD) and chemical mechanical planarization (CMP) processes. Such techniques however, require complicated processing and utilize materials that may not be compatible with BEOL applications. For example, various materials in such processes require high temperature deposition.

Illustrative embodiments provide techniques for forming arrays of pillars using BEOL-compatible processing, where a bottom memorization layer is thin and formed from a material that may be etched or otherwise removed selective to a material used for spacers, thus providing improved planarization. Embodiments further provide cost-sensitive fabrication for BEOL memory applications, forming arrays of pillars while avoiding complex fabrication steps where possible. For example, planarization steps that involve or utilize flowable CVD (FCVD) or other high temperature deposition processes and chemical mechanical planarization (CMP) will cost more, from a device fabrication process complexity perspective, than spin-on processes. Thus, some embodiments use spin-on processes rather than FCVD and CMP where possible. In some cases, it may be desired to remove spacers before planarization. While selective wet etches may be used to accomplish this, BEOL-compatible memory applications have limitations on materials and process temperature selection. Thus, some embodiments use dry selective etching for removing spacers.

A process for forming BEOL-compatible pillar arrays will now be described with respect to FIGS. 1A-14.

Figure 1B:
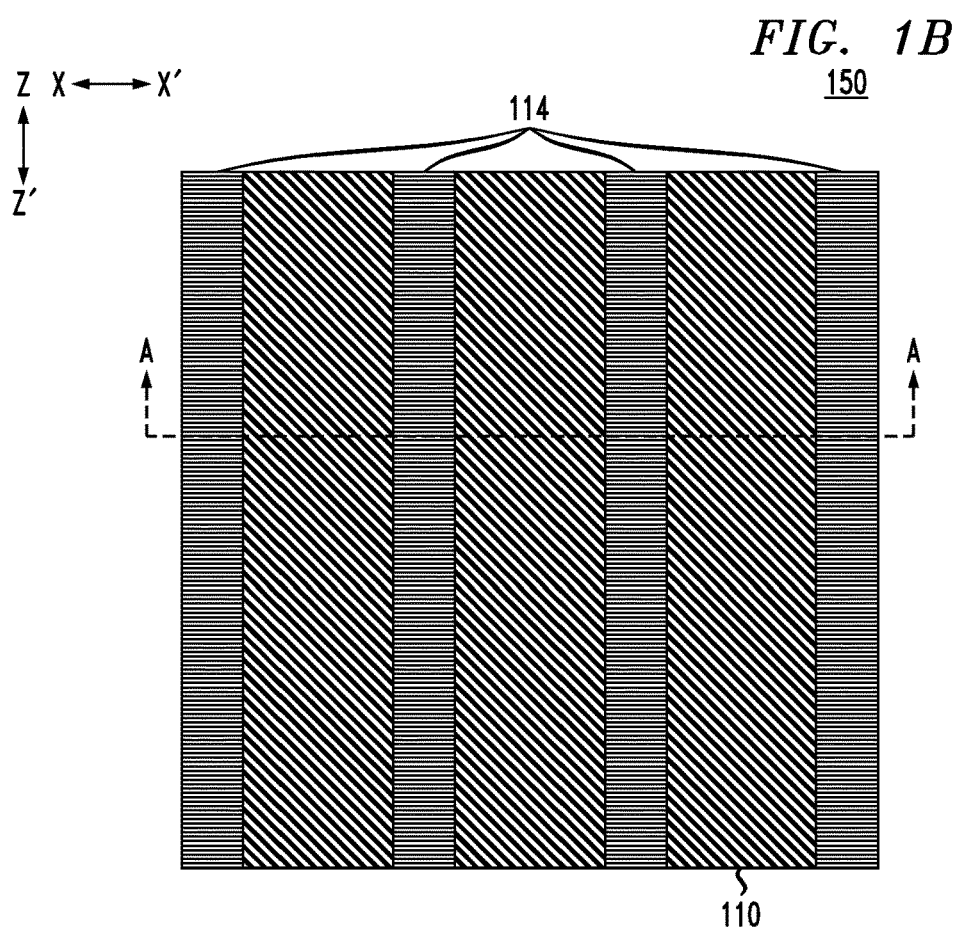
FIG. 1B depicts a top-down view of the FIG. 1A structure, according to an embodiment of the invention.

FIG. 1A shows a side-cross sectional view 100 of a semiconductor structure that includes a substrate 102, a hard mask layer 104, a bottom memorization layer 106, an organic planarization layer (OPL) 108, a mask layer 110, a first set of mandrels 112 and a coating layer 114 formed over the first set of mandrels 112. FIG. 1B shows a top-down view 150 of the structure shown in FIG. 1A. The side cross-sectional view 100 of FIG. 1A is taken along the line A-A in the top-down view 150 of FIG. 1B.

The substrate 102 generally represents a set of underlayers, which may include a target material over BEOL structures, such as copper (Cu) with one or more capping layers. The target material may vary depending on the memory device being formed. In some embodiments, the target material may comprise one or more magnetic materials (e.g., for an MRAM device), an intermediate hard mask (e.g., formed of hafnium oxide ($HfO_x$), titanium nitride (TiN), tantalum nitride (TaN), tungsten (W), etc.) for patterning final memory devices, etc. The substrate 102 may have a height or vertical thickness (in direction Y-Y') in the range of about 5 to 100 nanometers (nm). If the substrate 102 provides active memory layers, it may be thinner than if the substrate 102 provides an intermediate hard mask. The width or horizontal thickness (in both direction X-X' and direction Z-Z') may vary as desired, such as based on the number of pillars that are to be formed.

The hard mask layer 104 may be formed over the substrate 102 using chemical vapor deposition (CVD), physical vapor deposition (PVD), atomic layer deposition (ALD), spin coating, etc. The hard mask layer 104 may comprise a BEOL tetraethyl orthosilicate (TEOS) (e.g., CVD TEOS formed with a temperature under about 400 degrees Celsius (° C.)), or another hard mask such as TiN also formed with a temperature under about 400° C. The hard mask layer 104 may have a height or vertical thickness (in direction Y-Y') in the range of about 5 to 50 nm.

The bottom memorization layer 106 may be formed over the hard mask layer 104 using PVD or other suitable processing such as ALD, CVD, spin coating, etc., with a temperature under about 400° C. When the bottom memorization layer is formed of amorphous silicon (a-Si), CVD is not suitable as it would require a high temperature (e.g., greater than about 400° C.). The bottom memorization layer 106 may be formed of a thin, low temperature, OPL-compatible material such as PVD a-Si, PVD titanium nitride (TiN), ALD titanium oxide ($TiO_x$), ALD aluminum oxide ($Al_2O_3$), etc. The bottom memorization layer 106 may have a height or vertical thickness (in direction Y-Y') in the range of about 5 to 50 nm, or more generally of about 30 nm or less.

The OPL layer 108 may be formed using spin-on coating or other suitable processing such as spin-on processes, although low temperature CVD amorphous carbon (a-C) could also be used. The OPL layer 108 may be formed of or using a precursor such as polyacrylate resin, epoxy resin, phenol resin, polyamide resin, polyimide resin, unsaturated polyester resin, polyphenylenether resin, polyphenylenesulfide resin, benzocyclobutene (BCB), etc. More generally, the OPL layer 108 may be formed of a-C with a certain amount of non-metallic, non-Si elements. The OPL layer 108 may have a height or vertical thickness (in direction Y-Y') in the range of about 30 to 200 nm.

The mask layer 110 may be formed using PVD or other suitable processing similar to that of the bottom memorization layer 106. The mask layer 110 may be formed of a-Si or another suitable material such as $TiO_x$, TiN, $Al_2O_3$, etc. The mask layer 110 may have a height or vertical thickness (in direction Y-Y') in the range of about 5 to 30 nm, or more generally approximately equal to or thinner than the bottom memorization layer 106.

The first set of mandrels 112 may be formed of an OPL material similar to the OPL layer 108. The first set of mandrels 112 are shown as formed in a first direction. In later processing, a second set of mandrels 122 are formed in a second direction (e.g., perpendicular or angled relative to the direction of the first set of mandrels 112). In this way, using two SADP steps, the array of pillars may be formed as described. The first set of mandrels 112 may each have a width or horizontal thickness (in direction X-X') in the range of about 5 to 50 nm, and a height or vertical thickness (in direction Y-Y') in the range of about 50 to 150 nm. In some embodiments, the mandrels 112 may be formed with a height or vertical thickness (in direction Y-Y') that is less than 100 nm, such as a height of about 60 nm. Shorter mandrels 112 can advantageously make it easier to burn off the spacers 116 as described in further detail below. The spacing 101 between each of the mandrels 112 may be in the range of about 60 to 500 nm, based on the design requirements for the final pillar array.

The coating layer 114 is formed over each of the mandrels 112. The coating layer 114 may be formed of a silicon-containing anti-reflective coating (SiARC) material. The coating layer 114 may have a height or vertical thickness (in direction Y-Y') in the range of about 15 to 40 nm.

The material of the mandrels 112 and coating layer 114 may initially be formed over the mask layer 110. An additional mask or photoresist layer may be patterned over these materials, followed by etching (e.g., reactive-ion etching (ME)) to result in the structure as shown in FIGS. 1A and 1B. The mandrels 112 and coating layer 114 may be deposited using spin-coating before the resist and lithography exposure in the same tool.

Figure 2:
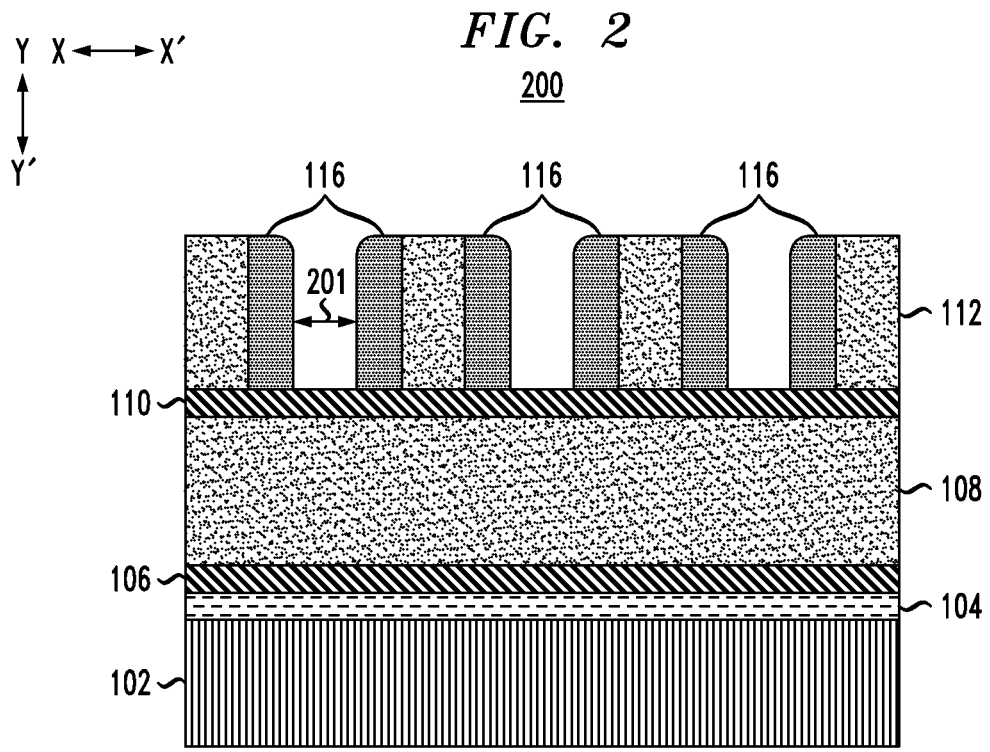
FIG. 2 depicts a side cross-sectional view of the FIG. 1A structure following formation of a first set of spacers on sidewalls of the first set of mandrels, according to an embodiment of the invention.

FIG. 2 shows a side cross-sectional view 200 of the structure shown in FIGS. 1A and 1B, following formation of a first set of spacers 116 on sidewalls of the mandrels 112. The side cross-sectional view 200 of FIG. 2, similar to the side cross-sectional view 100 of FIG. 1A, is taken along the line A-A shown in the top-down view 150 of FIG. 1B. To form the first set of spacers 116 a spacer material may be deposited using ALD or other suitable processing such as low temperature (e.g., under about 400° C.) CVD, followed by etch-back using ME. During etch-back of the spacer material, the coating layer 114 may be removed. The spacers 116 may be formed of an oxide material such as a silicon oxide ($SiO_x$), titanium oxide ($TiO_x$) formed using low temperature CVD. If formed of $TiO_x$, however, the etch-back of the spacers 116 will be selective to the coating layer 114 (e.g., formed of SiARC) thus making the RIE processing more complicated. Thus, in some embodiments $SiO_x$ is preferred. Each of the spacers 116 may have a width or horizontal thickness (in direction X-X') in the range of about 10 to 50 nm. The spacing 201 between the spacers 116 may be in the range of about 40 to 500 nm.

Figure 3:
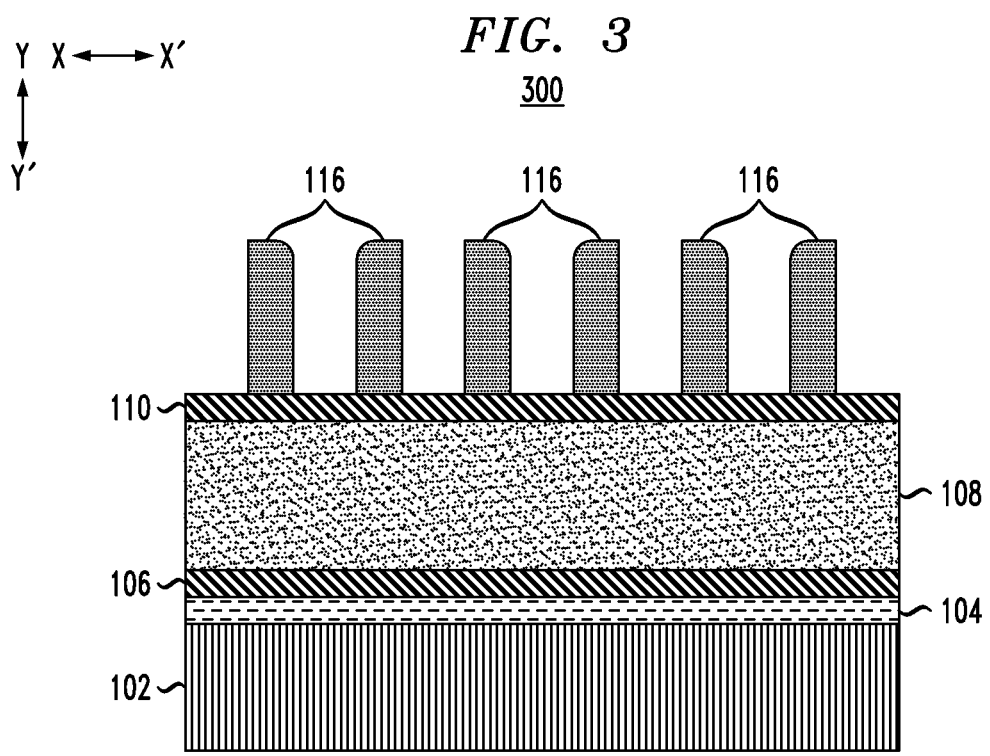
FIG. 3 depicts a side cross-sectional view of the FIG. 2 structure following removal of the first set of mandrels, according to an embodiment of the invention.

FIG. 3 shows a side cross-sectional view 300 of the FIG. 2 structure following removal of the mandrels 112. The side cross-sectional view 300 of FIG. 3, similar to the side cross-sectional view 100 of FIG. 1A, is taken along the line A-A shown in the top-down view 150 of FIG. 1B. The mandrels 112 may be removed using ashing or other suitable processing such as ME.

Figure 4:
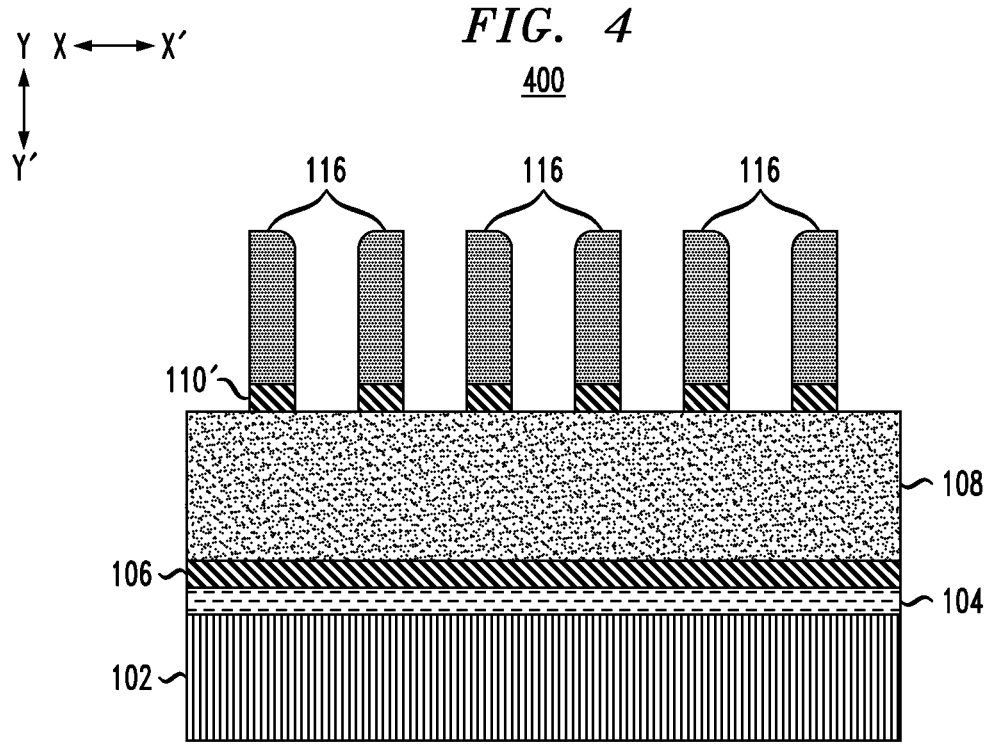
FIG. 4 depicts a side cross-sectional view of the FIG. 3 structure following etching to transfer a pattern of the first set of spacers to a first masking layer, according to an embodiment of the invention.

FIG. 4 shows a side cross-sectional view 400 of the FIG. 3 structure following etching to transfer a pattern of the spacers 116 to the mask layer 110. The side cross-sectional view 400 of FIG. 4, similar to the side cross-sectional view 100 of FIG. 1A, is taken along the line A-A shown in the top-down view 150 of FIG. 1B. The mask layer 110 may be etched using a dry etching process such as ME. The remaining portions of the mask layer 110 are labeled as 110' in FIG. 4.

Figure 5:
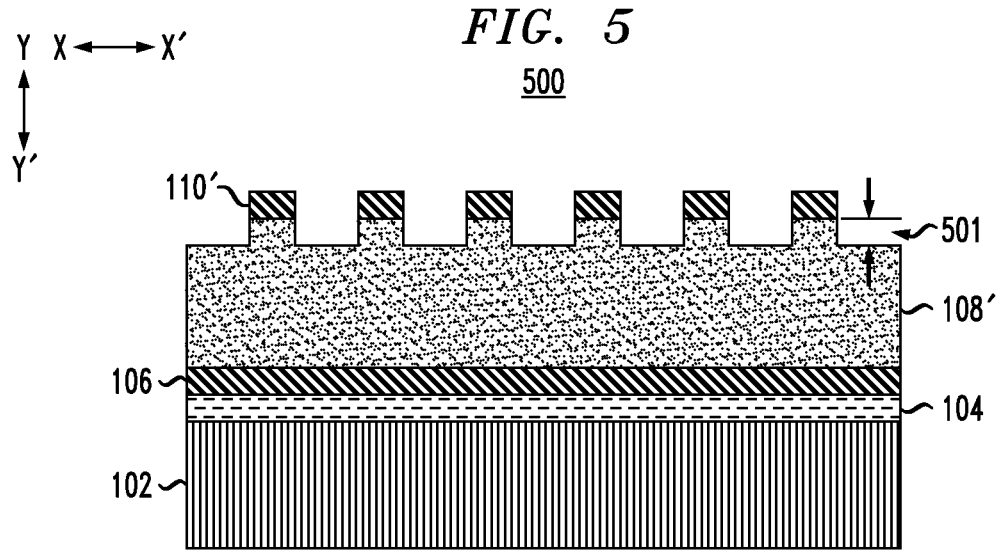
FIG. 5 depicts a side cross-sectional view of the FIG. 4 structure following removal of the first set of spacers, according to an embodiment of the invention.

FIG. 5 shows a side cross-sectional view 500 of the FIG. 4 structure following removal of the spacers 116. The side cross-sectional view 500 of FIG. 5, similar to the side cross-sectional view 100 of FIG. 1A, is taken along the line A-A shown in the top-down view 150 of FIG. 1B. The spacers 116 may be removed using a selective dry etching process such as a plasma etching or vapor-phase chemical oxide removal etch. Such processing advantageously provides for better selectivity relative to wet etch or CMP processes and has less restriction on material choices. As shown in FIG. 5, this selective dry etching process, also referred to as a spacer burn-off, may etch into portions of the OPL layer 108 (e.g., to a depth 501 in the range of about 5 to 30 nm). The remaining portions of the OPL layer 108 are labeled as 108' in FIG. 5. In other embodiments, however, the dry etching process used to remove the spacers 116 may be chosen such that it is selective to the material of the OPL layer 108 such that it does not etch or etches very little into the OPL layer 108.

Figure 6:
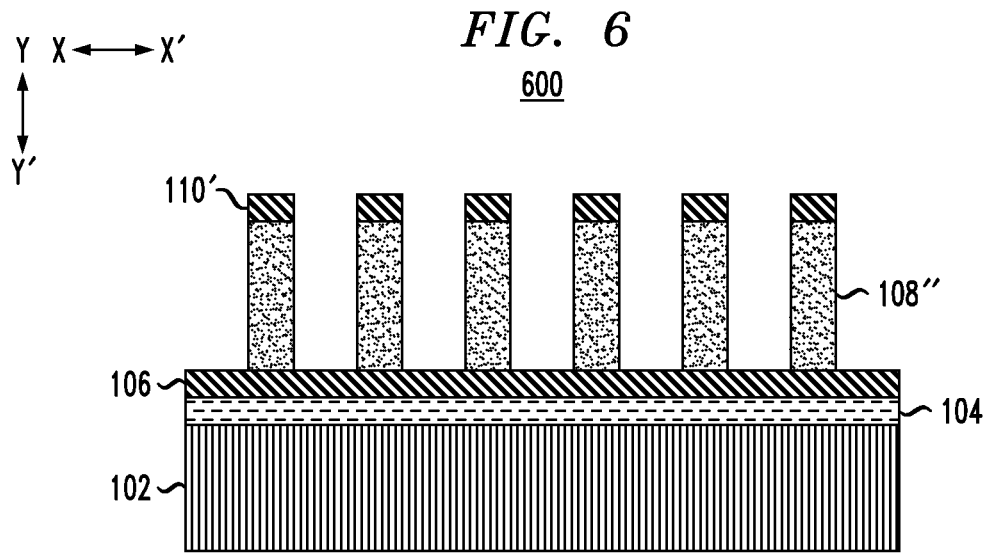
FIG. 6 depicts a side cross-sectional view of the FIG. 5 structure following removal of exposed portions of the first organic planarization layer below the first masking layer, according to an embodiment of the invention.

FIG. 6 shows a side cross-sectional view 600 of the FIG. 5 structure following removal of exposed portions of the OPL layer 108'. The side cross-sectional view 600 of FIG. 6, similar to the side cross-sectional view 100 of FIG. 1A, is taken along the line A-A shown in the top-down view 150 of FIG. 1B. The exposed portions of the OPL layer 108' may be removed using ME. The remaining portions of the OPL layer 108' are labeled as OPL layer 108" in FIG. 6.

Figure 7:
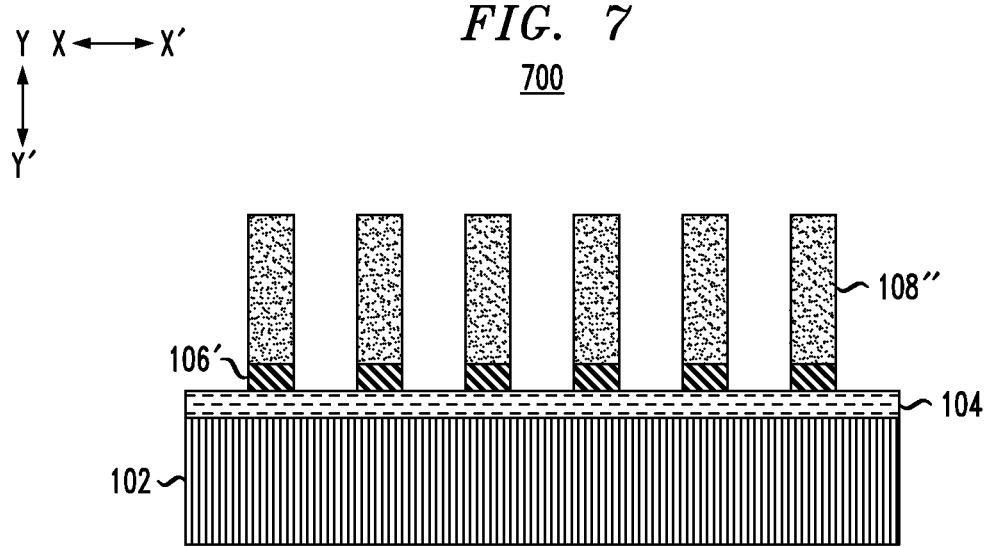
FIG. 7 depicts a side cross-sectional view of the FIG. 6 structure following transfer of the pattern of the first set of spacers to a bottom memorization layer below the first organic planarization layer, according to an embodiment of the invention.

FIG. 7 shows a side cross-sectional view 700 of the FIG. 6 structure following transferring of the pattern (of the spacers 116, previously transferred to the mask layer 110 and OPL layer 108 as mask layer 110' and OPL layer 108" as described above) to the bottom memorization layer 106. The side cross-sectional view 700 of FIG. 7, similar to the side cross-sectional view 100 of FIG. 1A, is taken along the line A-A shown in the top-down view 150 of FIG. 1B. The pattern may be transferred to the bottom memorization layer 106 using a dry etching process similar to that used above with respect to the processing of FIG. 4. In this step, the remaining portions of the mask layer 110' are removed as well. The remaining portions of the bottom memorization layer 106 are labeled as bottom memorization layer 106' in FIG. 7.

Figure 8A:
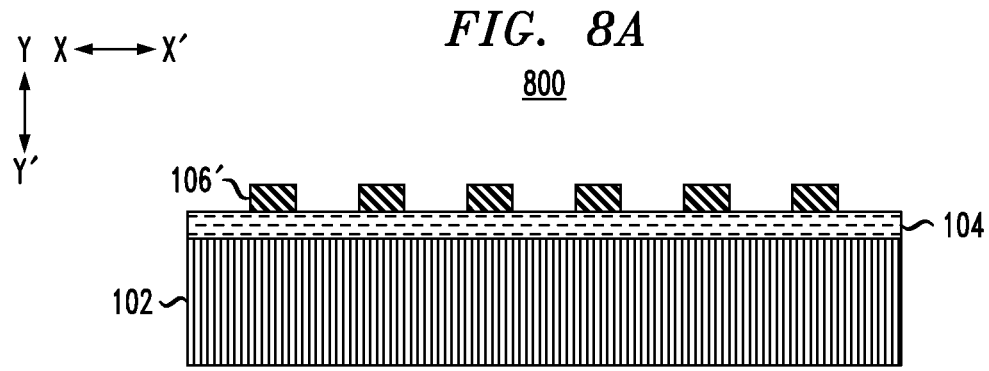
FIG. 8A depicts a side cross-sectional view of the FIG. 7 structure following removal of remaining portions of the first organic planarization layer, according to an embodiment of the invention.
Figure 8B:
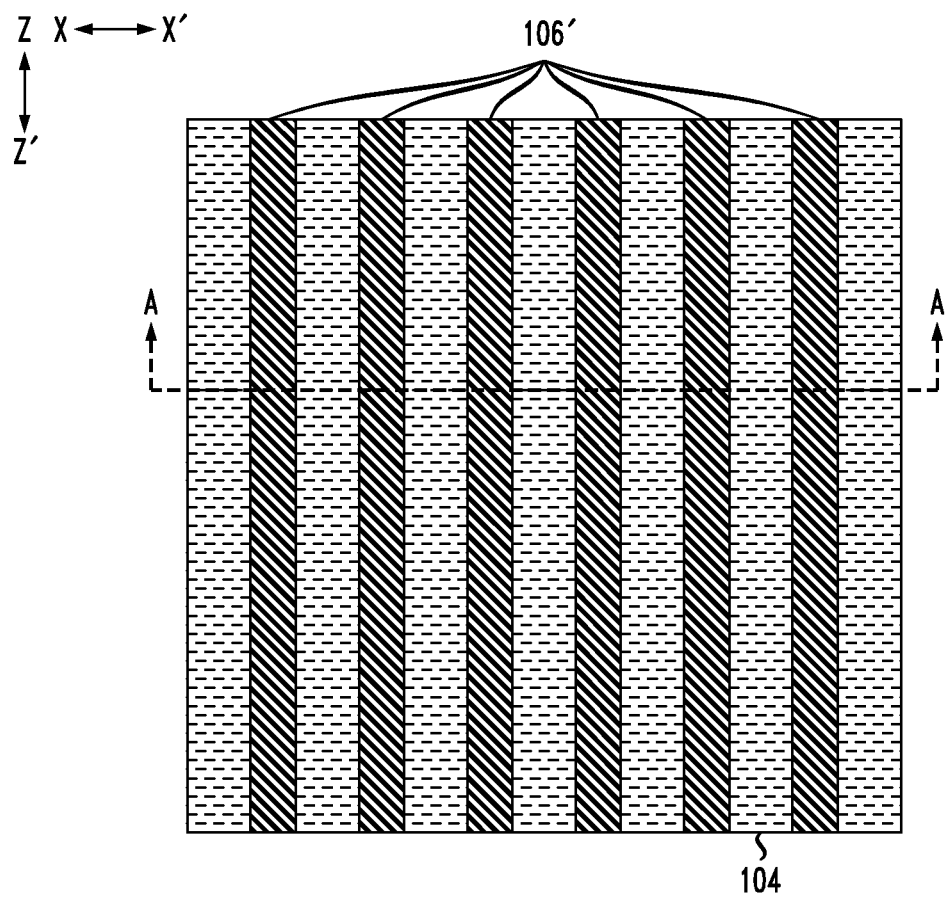
FIG. 8B depicts a top-down view of the FIG. 8A structure, according to an embodiment of the invention.

FIG. 8A shows a side cross-sectional view 800 of the FIG. 7 structure following removal of the OPL layer 108", using ashing or other suitable processing such as ME. FIG. 8B shows a top-down view 850 of the structure shown in FIG. 8A. The side cross-sectional view 800 of FIG. 8A is taken along the line A-A shown in the top-down view 850 of FIG. 8B.

Figure 9:
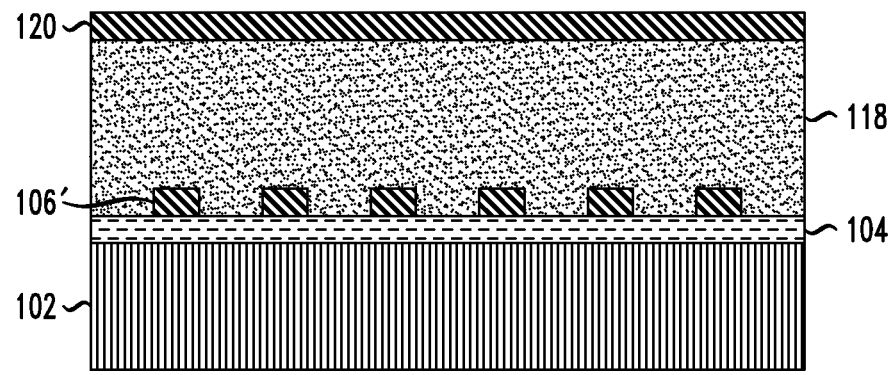
FIG. 9 depicts a side cross-sectional view of the FIG. 8A structure following formation of a second organic planarization layer and a second masking layer, according to an embodiment of the invention.

FIG. 9 shows a side cross-sectional view 900 of the structure shown in FIGS. 8A and 8B following formation of another OPL layer 118 and another masking layer 120 over the bottom memorization layer 106'. The OPL layer 118 and masking layer 120 may be formed using similar processing, materials and sizing as that described above with respect to OPL layer 108 and masking layer 110. Advantageously, formation of the OPL 118 provides a direct planarization method instead of using CVD and CMP. The side cross-sectional view 900 of the FIG. 9, similar to the side cross-sectional view 800 of FIG. 8A, is taken along the line A-A shown in the top-down view 850 of FIG. 8B.

Figure 10A:
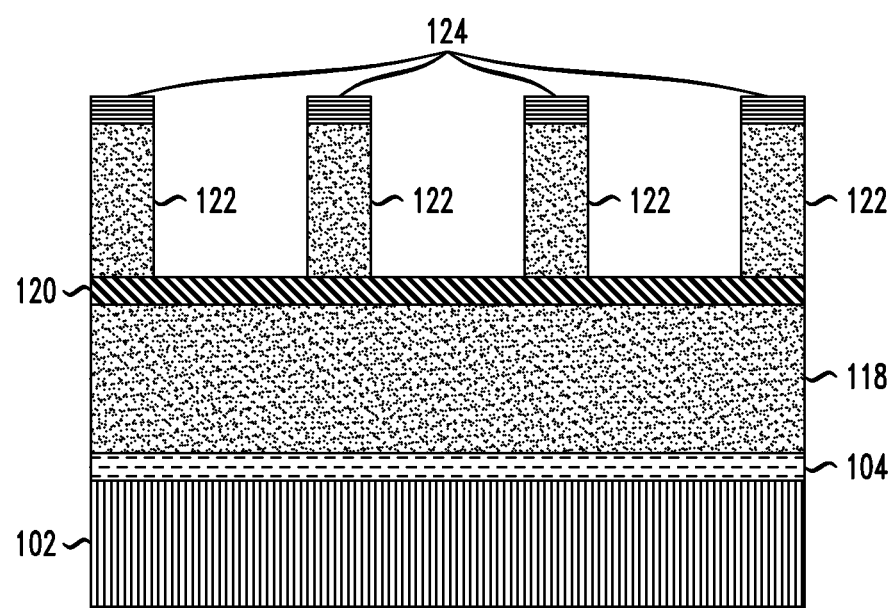
FIG. 10A depicts a side cross-sectional view of the FIG. 9 structure following formation of a second set of mandrels, according to an embodiment of the invention.
Figure 10B:
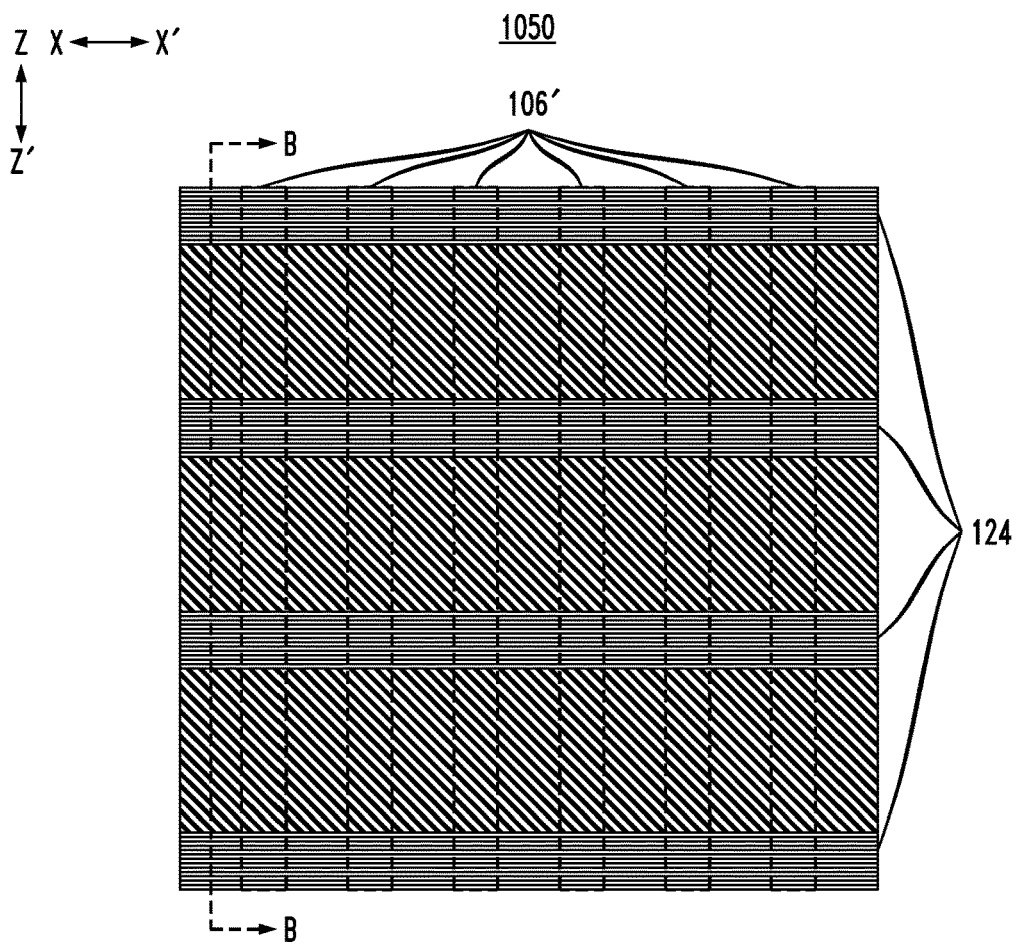
FIG. 10B depicts a top-down view of the FIG. 10A structure, according to an embodiment of the invention.

FIG. 10A shows a side cross-sectional view 1000 of the FIG. 9 structure following formation of the second set of mandrels 122 and coating layer 124, using processing similar to that described above with respect to the first set of mandrels 112 and coating layer 114. The second set of mandrels 122, however, are formed in a different direction (e.g., perpendicular to the first set of mandrels 112) as illustrated in the top-down view 1050 of FIG. 10B. The side cross-sectional view 1000 of FIG. 10A is taken along the line B-B shown in the top-down view 1050 of FIG. 10B. The mandrels 122 and coating layer 124 may be formed of similar materials and with similar sizing as that described above with respect to the mandrels 112 and coating layer 114. The bottom memorization layer 106' is shown in dashed outline in the top-down view 1050 of FIG. 10B.

Figure 11A:
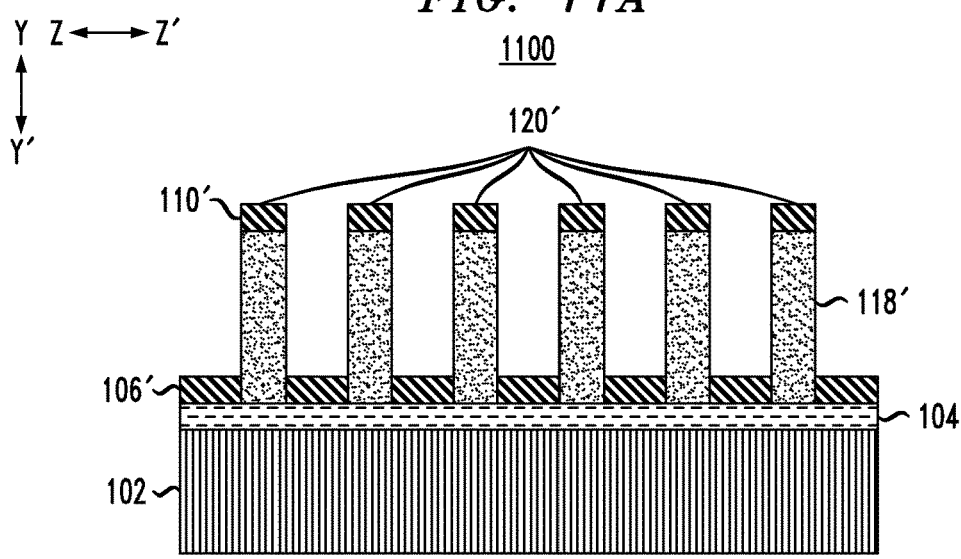
FIG. 11A depicts a side cross-sectional view of the FIG. 10A structure following transfer of a pattern of a second set of spacers formed on sidewalls of the second set of mandrels into the second organic planarization layer and the second mask layer, according to an embodiment of the invention.
Figure 11B:
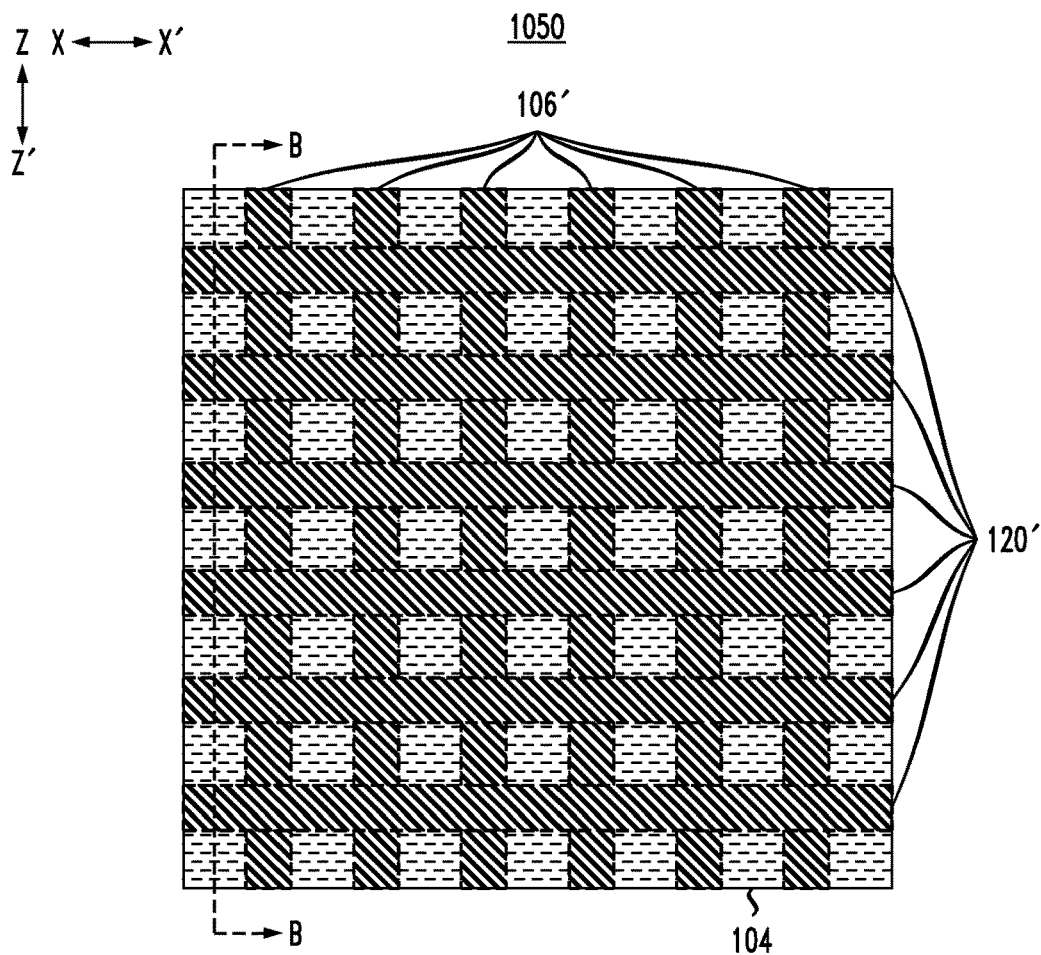
FIG. 11B depicts a top-down view of the FIG. 11A structure, according to an embodiment of the invention.

FIG. 11A shows a side cross-sectional view 1100 of the FIG. 10A structure following the deposition, etch-back, and transfer of the pattern of a second set of spacers (not shown) into the masking layer 120 and OPL layer 118 in a manner similar to that described above with respect to FIGS. 2-6. The side cross-sectional view 1100 of FIG. 11A is taken along the line B-B shown in the top-down view 1150 of FIG. 11B. The remaining portions of masking layer 120 and OPL layer 118 are labeled as masking layer 120' and OPL layer 118' in FIG. 11A. The bottom memorization layer 106' is shown in dashed outline in the top-down view 1150 of FIG. 11B.

Figure 12A:
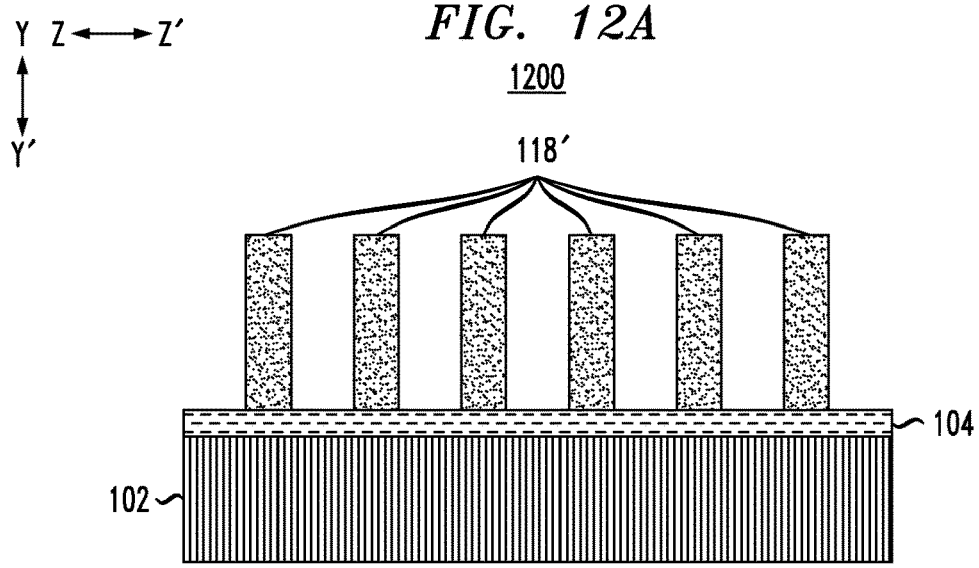
FIG. 12A depicts a side cross-sectional view of the FIG. 11A structure following transferring the pattern of the second set of spacers into the bottom memorization layer to form a set of pillars, according to an embodiment of the invention.
Figure 12B:
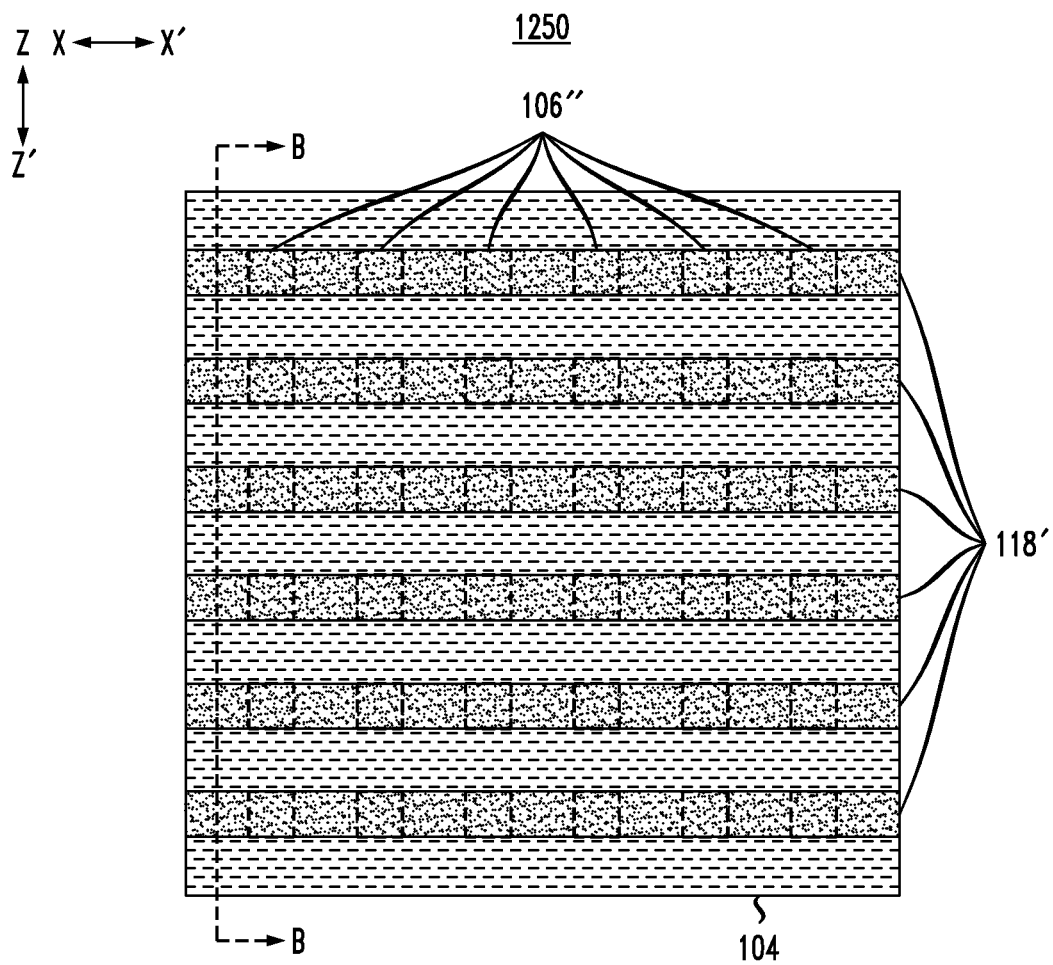
FIG. 12B depicts a top-down view of the FIG. 12A structure, according to an embodiment of the invention.

FIG. 12A shows a side cross-sectional view 1200 of the FIG. 11A structure following transfer of the pattern of the mask layer 120' and OPL layer 118' into the bottom memorization layer 106', using processing similar to that described above with respect to FIG. 7. The side cross-sectional view 1200 of FIG. 12A is taken along the line B-B shown in the top-down view 1250 of FIG. 12B. The remaining portions of the bottom memorization layer 106' are labeled as pillars 106" and shown in dashed outline in the top-down view 1250 of FIG. 12B.

Figure 13A:
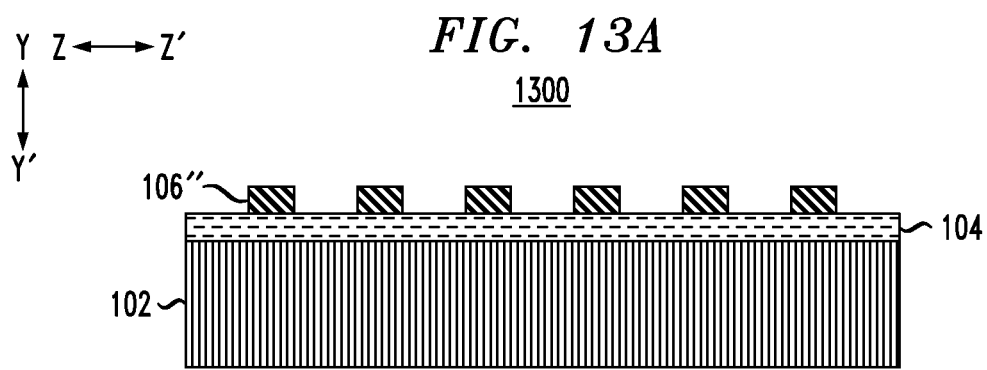
FIG. 13A depicts a side cross-sectional view of the FIG. 12A structure following removal of remaining portions of the second organic planarization layer, according to an embodiment of the invention.

FIG. 13A shows a side cross-sectional view 1300 of the FIG. 12A structure following removal of the OPL layer 118', using processing similar to that described above with respect to FIG. 8, thus exposing the array of pillars 106". The side cross-sectional view 1300 of FIG. 13A is taken along the line C-C shown in the top-down view 1350 of FIG. 13B.

Figure 13B:
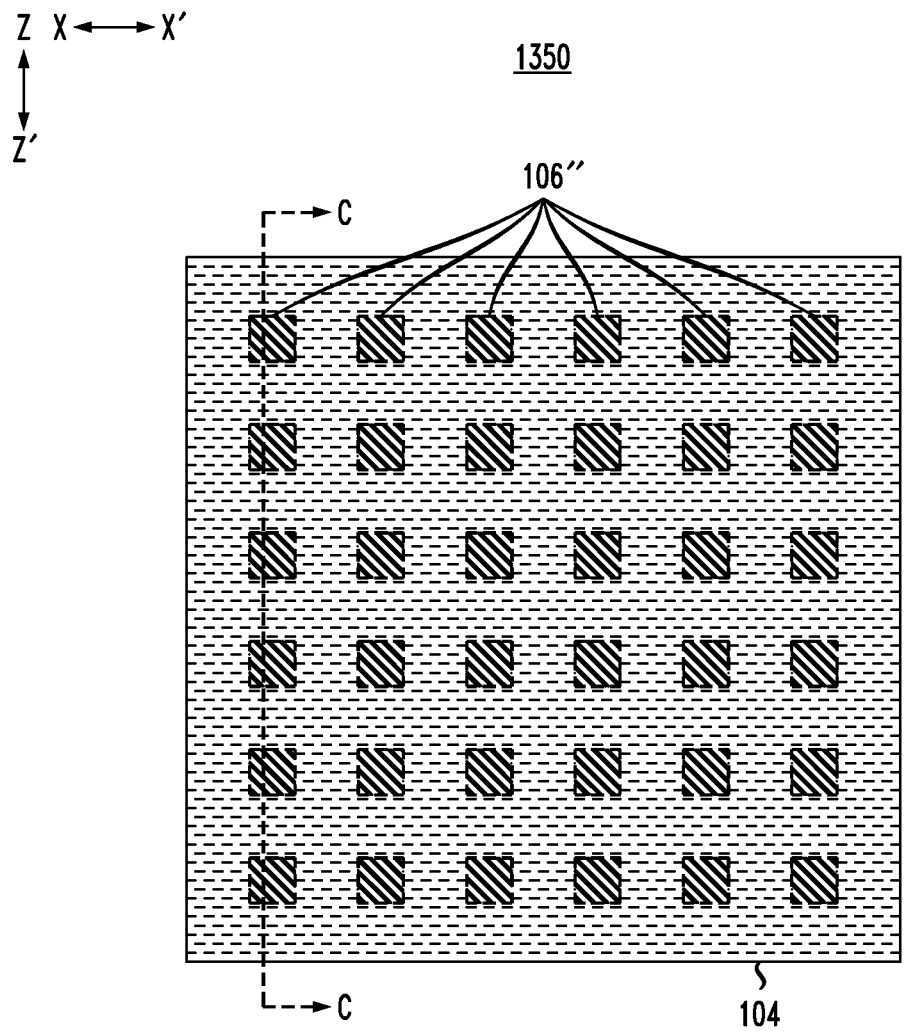
FIG. 13B depicts a top-down view of the FIG. 13A structure, according to an embodiment of the invention.
Figure 14:
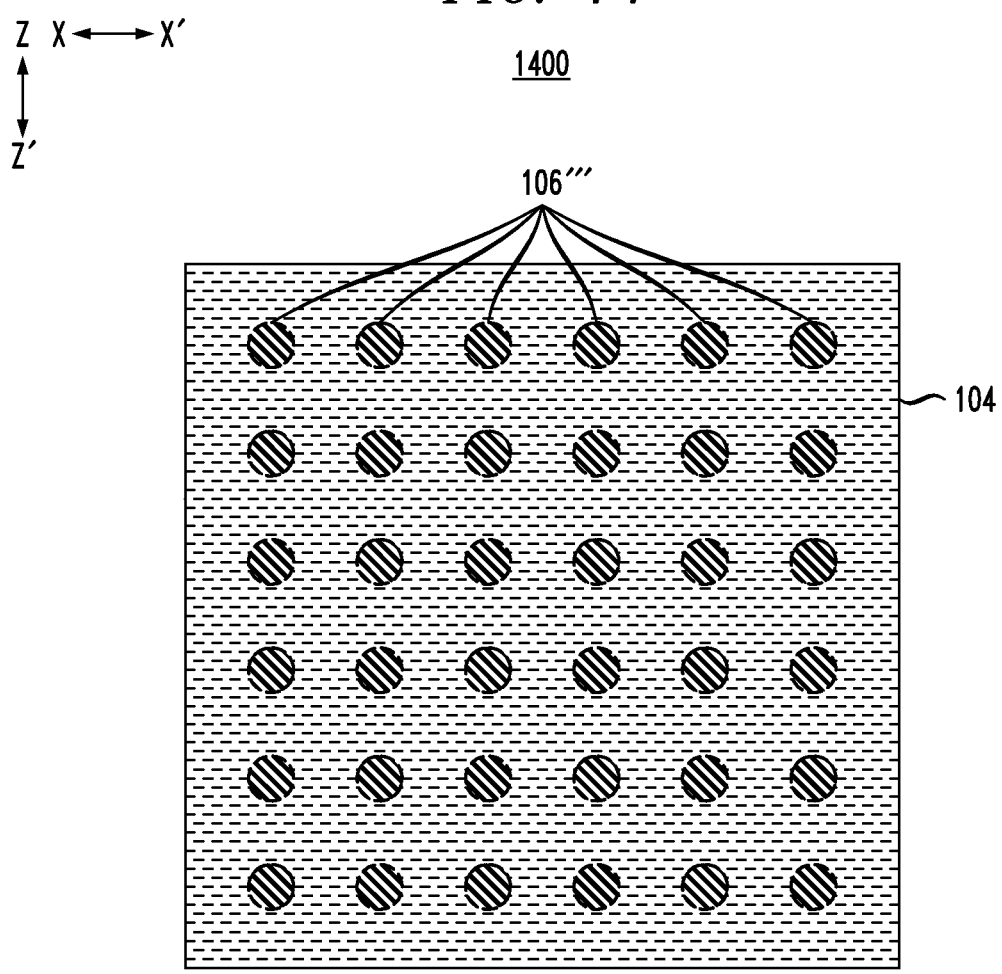
FIG. 14 depicts a top-down view of the FIG. 13A structure following rounding of corners of the set of pillars, according to an embodiment of the invention.

FIG. 14 shows a top-down view 1400 of the structure shown in FIGS. 13A and 13B following an optional corner rounding step, where the array of pillars 106" have their corners rounded resulting in cylindrical pillars 106'". The corner rounding may use a selective oxide etch or other suitable processing with minimal height loss of the cylindrical pillars 106'" (e.g., about 10 nm or less). The selective oxide etch is a highly anisotropic process. Isotropic processes may also or alternatively be used. Cylindrical pillars 106' may be desired for certain use cases, such as in dynamic random-access memory (DRAM) or other types of memory cells, capacitors, etc. It should be appreciated, however, that the squared or rectangular pillars 106" shown in FIGS. 13A and 13B may alternatively be used in these and other applications.

In some embodiments, a method of forming a semiconductor structure comprises forming a memorization layer over a substrate, forming a first OPL over the memorization layer, forming a first masking layer over the first OPL, forming a first set of mandrels over the first masking layer, the first set of mandrels being aligned in a first direction, forming a first set of spacers on sidewalls of the first set of mandrels, and transferring a first pattern of the first set of spacers to the memorization layer, wherein transferring the first pattern of the first set of spacers to the memorization layer comprises removing the first set of mandrels, the first set of spacers, the first masking layer and the first OPL. The method also comprises forming a second OPL over the patterned memorization layer, forming a second masking layer over the second OPL, forming a second set of mandrels over the second masking layer, the second set of mandrels being aligned in a second direction different than the first direction, forming a second set of spacers on sidewalls of the second set of mandrels, and transferring a second pattern of the second set of spacers to the patterned memorization layer to form an array of pillars from the patterned memorization layer, wherein transferring the second pattern of the second set of spacers to the memorization layer comprises removing the second set of mandrels, the second set of spacers, the second masking layer and the second OPL.

The memorization layer, the first masking layer and the second masking layer may comprise a-Si or TiN formed using PVD, or $TiO_x$ or $Al_2O_3$ formed using ALD.

Transferring the first pattern of the first set of spacers to the memorization layer may comprise removing the first set of mandrels to expose portions of the first masking layer, removing the exposed portions of the first masking layer to expose portions of the first OPL, removing the first set of spacers, removing the exposed portions of the first OPL to expose portions of the memorization layer, removing remaining portions of the first masking layer and the exposed portions of the memorization layer, and removing remaining portions of the first OPL. Removing the exposed portions of the first masking layer, removing the remaining portions of the masking layer, and removing the exposed portions of the memorization layer may utilize a dry etching process. Removing the first set of spacers may utilize a plasma etching process. Removing the exposed portions of the first OPL and removing the remaining portions of the first OPL may utilize a plasma ashing process.

Transferring the second pattern of the second set of spacers to the patterned memorization layer may comprise removing the second set of mandrels to expose portions of the second masking layer, removing the exposed portions of the second masking layer to expose portions of the second OPL, removing the second set of spacers, removing the exposed portions of the second OPL to expose portions of the patterned memorization layer, removing remaining portions of the second masking layer and the exposed portions of the patterned memorization layer, and removing remaining portions of the second OPL.

The second direction may be perpendicular to the first direction.

The pillars may define memory cells for a BEOL memory structure. The BEOL memory structure may have a thermal budget for fabrication processing not permitting CVD and CMP processes.

The method may further comprise rounding corners of the pillars formed from the patterned memorization layer.

In some embodiments, a method of forming a BEOL memory device comprises forming a memorization layer over a substrate and forming a first self-aligned double patterning stack, the first self-aligned double patterning stack comprising a first OPL formed over the memorization layer, a first masking layer formed over the first OPL, a first set of mandrels formed over the first masking layer, and a first set of spacers formed on sidewalls of the first set of mandrels. The method also comprises forming a patterned memorization layer using a first self-aligned double patterning that transfers a first pattern of the first set of spacers to the memorization layer and forming a second self-aligned double patterning stack, the second self-aligned double patterning stack comprising a second OPL formed over the patterned memorization layer, a second masking layer formed over the second OPL, a second set of mandrels formed over the second masking layer, and a second set of spacers formed on sidewalls of the second set of mandrels. The method further comprises forming an array of pillars from the patterned memorization layer using a second self-aligned double patterning that transfers a second pattern of the second set of spacers to the patterned memorization layer. The first OPL, the second OPL, the first set of mandrels and the second set of mandrels comprise a spin-on coated OPL material. The memorization layer, the first masking layer and the second masking layer comprise a material configured for removal selective to the spin-on coated OPL material.

The BEOL memory device has a thermal budget for fabrication processes used to form the array of pillars. The material configured for removal selective to the spin-on coated OPL material comprises at least one of: a-Si formed using a PVD process at a temperature within the thermal budget of the BEOL memory device, TiN formed using a PVD process at a temperature within the thermal budget of the BEOL memory device, $TiO_x$ formed using an ALD process at a temperature within the thermal budget of the BEOL memory device, and $Al_2O_3$ formed using an ALD process at a temperature within the thermal budget of the BEOL memory device.

In another embodiment, a semiconductor structure comprises a substrate, a memorization layer disposed over the substrate, an OPL disposed over the memorization layer, a masking layer disposed over the OPL, a set of mandrels disposed over the masking layer, and a set of spacers disposed on sidewalls of the set of mandrels. A pattern of the set of spacers is configured for transfer to the memorization layer using fabrication processes within a thermal budget of a back-end-of-line memory device. The OPL and the set of mandrels comprise a spin-on coated OPL material. The memorization layer and the masking layer comprise a material configured for removal selective to the spin-on coated OPL material.

The material configured for removal selective to the spin-on coated OPL material may comprise at least one of a-Si formed using a PVD process at a temperature within the thermal budget of the BEOL memory device and TiN formed using a PVD process at a temperature within the thermal budget of the BEOL memory device.

The material configured for removal selective to the spin-on coated OPL material may comprise at least one of $TiO_x$ formed using an ALD process at a temperature within the thermal budget of the BEOL memory device and $Al_2O_3$ formed using an ALD process at a temperature within the thermal budget of the BEOL memory device.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a back-end-of-line memory device, comprising:
    forming a memorization layer over a substrate;
    forming a first self-aligned double patterning stack, the first self-aligned double patterning stack comprising a first organic planarization layer formed over the memorization layer, a first masking layer formed over the first organic planarization layer, a first set of mandrels formed over the first masking layer, and a first set of spacers formed on sidewalls of the first set of mandrels;
    forming a patterned memorization layer by transferring a first pattern of the first set of spacers to the memorization layer;
    forming a second self-aligned double patterning stack, the second self-aligned double patterning stack comprising a second organic planarization layer formed over the patterned memorization layer, a second masking layer formed over the second organic planarization layer, a second set of mandrels formed over the second masking layer, and a second set of spacers formed on sidewalls of the second set of mandrels; and
    forming an array of pillars from the patterned memorization layer by transferring a second pattern of the second set of spacers to the patterned memorization layer;
    wherein the first organic planarization layer, the second organic planarization layer, the first set of mandrels and the second set of mandrels comprise a spin-on coated organic planarization layer material; and
    wherein the memorization layer, the first masking layer and the second masking layer comprise a material configured for removal selective to the spin-on coated organic planarization layer material.

2. The method of claim 1, wherein the back-end-of-line memory device has a thermal budget for fabrication processes used to form the array of pillars.

3. The method of claim 2, wherein the material configured for removal selective to the spin-on coated organic planarization layer material comprises at least one of:
    amorphous silicon (a-Si) formed using a physical vapor deposition (PVD) process at a temperature within the thermal budget of the back-end-of-line memory device;
    titanium nitride (TiN) formed using a PVD process at a temperature within the thermal budget of the back-end-of-line memory device;
    titanium oxide ($TiO_x$) formed using an atomic layer deposition (ALD) process at a temperature within the thermal budget of the back-end-of-line memory device; and
    aluminum oxide ($Al_2O_3$) formed using an ALD process at a temperature within the thermal budget of the back-end-of-line memory device.

4. A method of forming a semiconductor structure, comprising:
    forming a memorization layer over a substrate;
    forming a first organic planarization layer over the memorization layer;
    forming a first masking layer over the first organic planarization layer;
    forming a first set of mandrels over the first masking layer, the first set of mandrels being aligned in a first direction;
    forming a first set of spacers on sidewalls of the first set of mandrels;
    transferring a first pattern of the first set of spacers to the memorization layer, wherein transferring the first pattern of the first set of spacers to the memorization layer comprises removing the first set of mandrels, the first set of spacers, the first masking layer and the first organic planarization layer;
    forming a second organic planarization layer over the patterned memorization layer;
    forming a second masking layer over the second organic planarization layer;
    forming a second set of mandrels over the second masking layer, the second set of mandrels being aligned in a second direction different than the first direction;
    forming a second set of spacers on sidewalls of the second set of mandrels; and
    transferring a second pattern of the second set of spacers to the patterned memorization layer to form an array of pillars from the patterned memorization layer, wherein transferring the second pattern of the second set of spacers to the memorization layer comprises removing the second set of mandrels, the second set of spacers, the second masking layer and the second organic planarization layer.

5. The method of claim 4, wherein the memorization layer, the first masking layer and the second masking layer comprise amorphous silicon (a-Si).

6. The method of claim 5, wherein the a-Si of the memorization layer, the first masking layer and the second masking layer is formed using physical vapor deposition (PVD).

7. The method of claim 4, wherein the memorization layer, the first masking layer and the second masking layer comprise titanium nitride (TiN) formed using physical vapor deposition (PVD).

8. The method of claim 4, wherein the memorization layer, the first masking layer and the second masking layer comprise at least one of: titanium oxide ($TiO_x$) formed using atomic layer deposition (ALD); and aluminum oxide ($Al_2O_3$) formed using ALD.

9. The method of claim 4, wherein transferring the first pattern of the first set of spacers to the memorization layer comprises:
removing the first set of mandrels to expose portions of the first masking layer;
removing the exposed portions of the first masking layer to expose portions of the first organic planarization layer;
removing the first set of spacers;
removing the exposed portions of the first organic planarization layer to expose portions of the memorization layer;
removing remaining portions of the first masking layer and the exposed portions of the memorization layer; and
removing remaining portions of the first organic planarization layer.

10. The method of claim 9, wherein removing the exposed portions of the first masking layer, removing the remaining portions of the masking layer, and removing the exposed portions of the memorization layer utilize a dry etching process.

11. The method of claim 9, wherein removing the first set of spacers utilizes a plasma etching process.

12. The method of claim 9, wherein removing the exposed portions of the first organic planarization layer and removing the remaining portions of the first organic planarization layer utilize a plasma ashing process.

13. The method of claim 4, wherein transferring the second pattern of the second set of spacers to the patterned memorization layer comprises:
removing the second set of mandrels to expose portions of the second masking layer;
removing the exposed portions of the second masking layer to expose portions of the second organic planarization layer;
removing the second set of spacers;
removing the exposed portions of the second organic planarization layer to expose portions of the patterned memorization layer;
removing remaining portions of the second masking layer and the exposed portions of the patterned memorization layer; and
removing remaining portions of the second organic planarization layer.

14. The method of claim 4, wherein the second direction is perpendicular to the first direction.

15. The method of claim 4, wherein the pillars define memory cells for a back-end-of-line memory structure.

16. The method of claim 15, wherein the back-end-of-line memory structure has a thermal budget for fabrication processing not permitting chemical vapor deposition (CVD) and chemical mechanical planarization (CMP) processes.

17. The method of claim 4, further comprising rounding corners of the pillars formed from the patterned memorization layer.

18. A semiconductor structure, comprising:
a substrate;
a memorization layer disposed over the substrate;
an organic planarization layer disposed over the memorization layer;
a masking layer disposed over the organic planarization layer;
a set of mandrels disposed over the masking layer; and
a set of spacers disposed on sidewalls of the set of mandrels;
wherein a pattern of the set of spacers is configured for transfer to the memorization layer using fabrication processes within a thermal budget of a back-end-of-line memory device;
wherein the organic planarization layer and the set of mandrels comprise a spin-on coated organic planarization layer material; and
wherein the memorization layer and the masking layer comprise a material configured for removal selective to the spin-on coated organic planarization layer material.

19. The semiconductor structure of claim 18, wherein the material configured for removal selective to the spin-on coated organic planarization layer material comprises at least one of amorphous silicon (a-Si) and titanium nitride (TiN).

20. The semiconductor structure of claim 18, wherein the material configured for removal selective to the spin-on coated organic planarization layer material comprises at least one of titanium oxide ($TiO_x$) and aluminum oxide ($Al_2O_3$).

* * * * *